United States Patent
Hall

(10) Patent No.: US 7,250,358 B2
(45) Date of Patent: Jul. 31, 2007

(54) WAFER FOR PREVENTING THE FORMATION OF SILICON NODULES AND METHOD FOR PREVENTING THE FORMATION OF SILICON NODULES

(75) Inventor: Curtis Hall, Denison, TX (US)

(73) Assignee: GlobiTech Incorporated, Sherman, TX (US)

( * ) Notice: Subject to any disclaimer, the term of this patent is extended or adjusted under 35 U.S.C. 154(b) by 348 days.

(21) Appl. No.: 10/913,875

(22) Filed: Aug. 6, 2004

(65) Prior Publication Data
US 2006/0029817 A1   Feb. 9, 2006

(51) Int. Cl.
*H01L 21/20*   (2006.01)
(52) U.S. Cl. .......................... 438/481; 117/96
(58) Field of Classification Search ............ 117/2, 117/3, 95–97, 935; 438/479–509
See application file for complete search history.

(56) References Cited

U.S. PATENT DOCUMENTS

| | | | |
|---|---|---|---|
| 4,897,360 A * | 1/1990 | Guckel et al. | 216/2 |
| 5,637,145 A | 6/1997 | Miyanomae et al. | |
| 5,733,370 A | 3/1998 | Chen et al. | |
| 5,834,363 A * | 11/1998 | Masanori | 438/507 |
| 5,882,401 A | 3/1999 | Maruyama et al. | |
| 5,998,283 A * | 12/1999 | Takamizawa et al. | 438/476 |
| 6,146,980 A * | 11/2000 | Hsu | 438/471 |
| 6,315,826 B1 * | 11/2001 | Muramatsu | 117/95 |
| 6,562,692 B1 * | 5/2003 | Oi | 438/406 |
| 6,596,095 B2 * | 7/2003 | Ries et al. | 148/33.1 |
| 2003/0008435 A1 * | 1/2003 | Falster et al. | 438/149 |
| 2004/0200520 A1 * | 10/2004 | Mulligan et al. | 136/256 |

* cited by examiner

*Primary Examiner*—Savitri Mulpuri
(74) *Attorney, Agent, or Firm*—Rudolph J. Buchel, Jr.

(57) ABSTRACT

The present invention is directed to a wafer device method for processing same. A wafer for epitaxial deposition is backside sealed with a dopant seal layer (protection layer comprised of silicon dioxide or silicon nitride. Then, a layer of polysilicon is formed coextensively over the dopant seal layer. The polysilicon layer acts as a seed layer for potentially nodule forming gasses present during epitaxial deposition. During CVD epitaxy, the epitaxial layer is deposited on the primary surface with optimal resistivity uniformity. The fugitive gasses from the epitaxial process which diffuse to the wafer periphery and backside deposit as a film on the seed layer instead of in nodules. The polysilicon layer acts as a continuous seed layer which eliminates the preferential deposition at seal layer pinholes or island seed sites. The resulting structure of silicon substrate, dopant seal layer, polysilicon seed layer provides for nodule-free epitaxial deposition without increasing auto-doping and escalating the epitaxial resistivity non-uniformities.

Alternatively, the wafer is sealed on the backside and peripheral edges with a dopant seal layer. Then, a layer of polysilicon is formed over the entire extent of the dopant seal layer. CVD epitaxy is performed, growing an epitaxial layer on the front side and depositing a film layer on the back side and peripheral edges of the wafer. The fugitive gasses from the epitaxial process which diffuse to the wafer backside and edge deposit as a film on the seed layer instead of in nodules. The amount of out-gassing is reduced because the peripheral edges of the wafer are covered with the dopant seal layer and since that layer is not exposed to the reaction gases, silicon spur and nodule formation is thwarted.

26 Claims, 6 Drawing Sheets

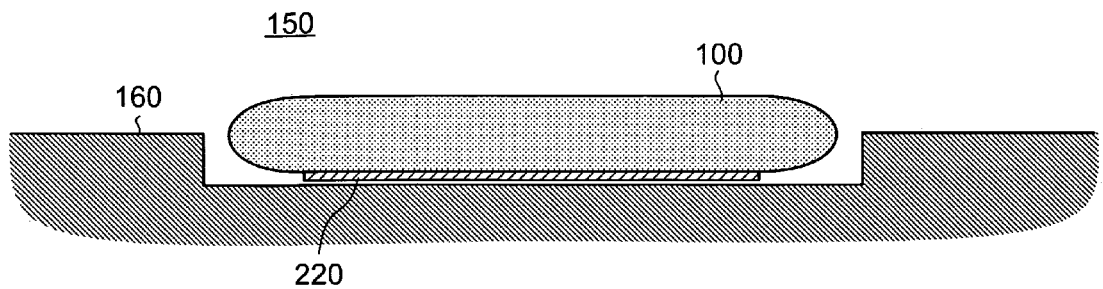
FIG. 2A
Prior Art
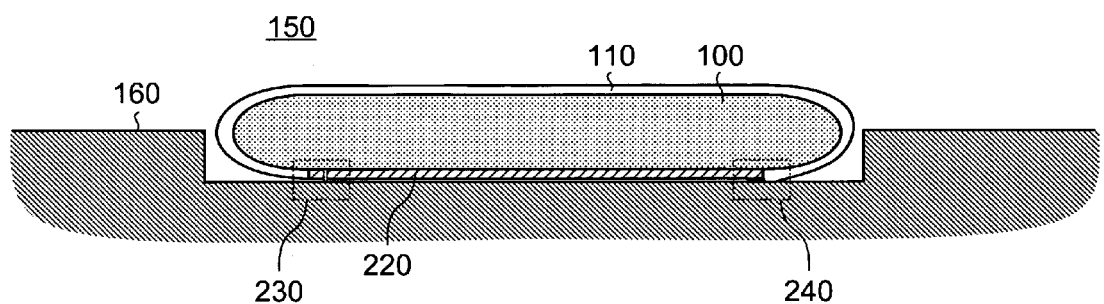
FIG. 2B
Prior Art
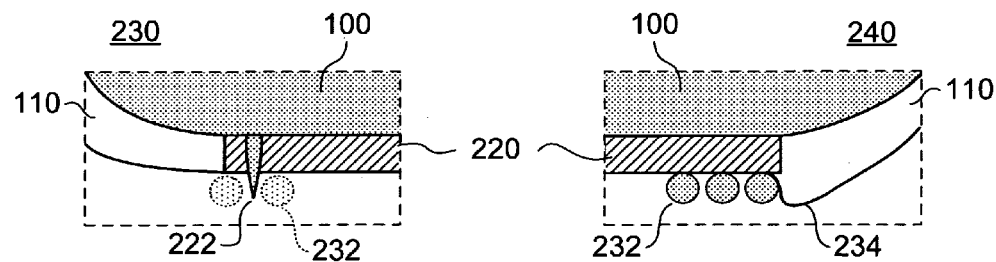
FIG. 2C
Prior Art
FIG. 2D
Prior Art

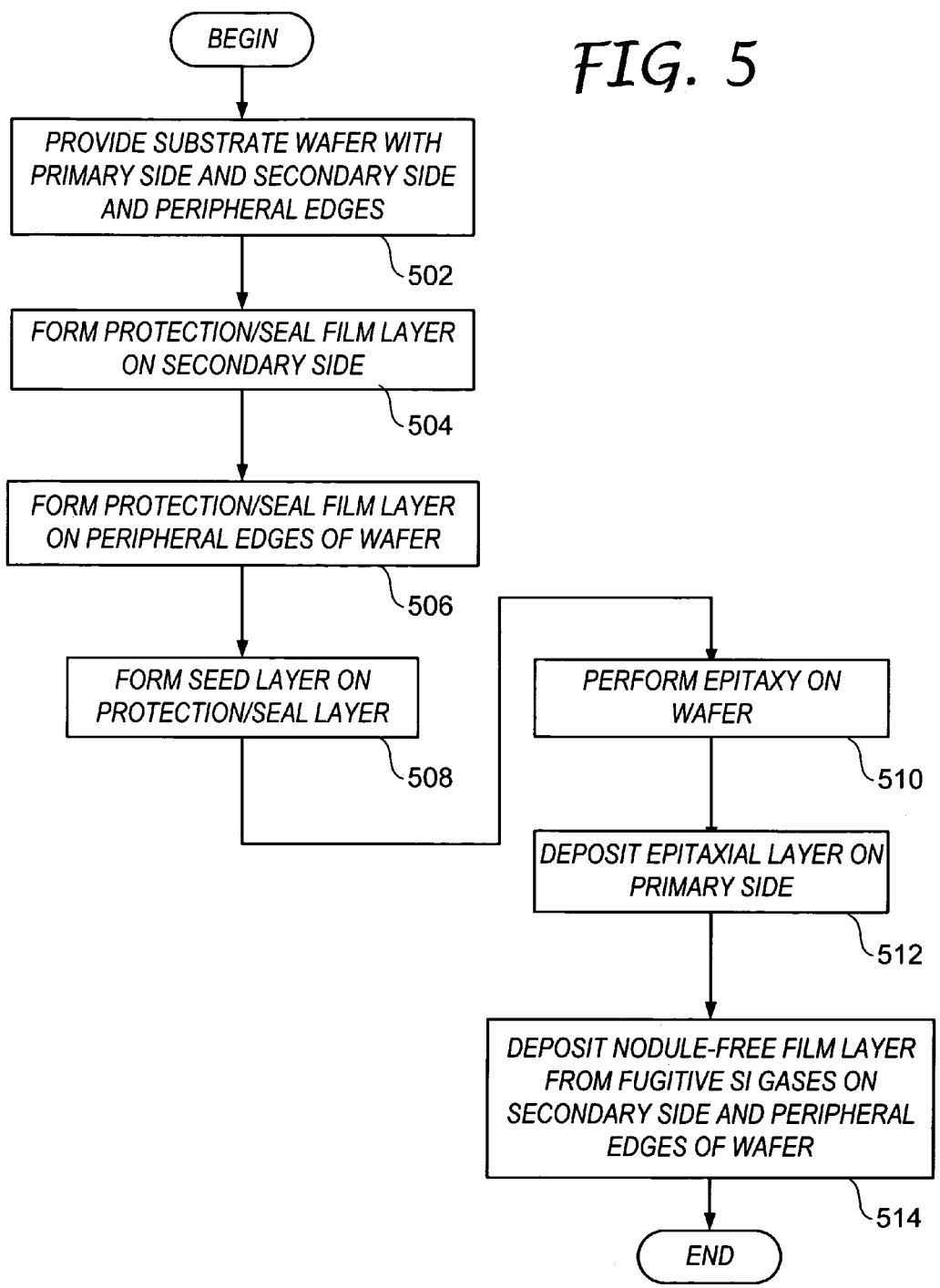

WAFER FOR PREVENTING THE FORMATION OF SILICON NODULES AND METHOD FOR PREVENTING THE FORMATION OF SILICON NODULES

BACKGROUND OF THE INVENTION

1. Field of the Invention

The present invention relates to semiconductor wafer manufacturing. More particularly, the present invention relates to a wafer for preventing the formation of silicon nodules, the manufacturing of wafers for preventing the formation of silicon nodules. Still more particularly, the present invention relates to epitaxy and a method for producing an epitaxial layer on a wafer with superior dopant uniformity and a nodule-free, smooth underside.

2. Description of Related Art

In semiconductor device manufacturing the structure of a lightly doped layer on a heavily doped substrate or wafer is commonly required. This structure provides electrical benefits for designers of integrated logic circuits such as transistor latch-up suppression, and soft-error immunity. In addition, numerous discrete power transistors and diodes are built using this structure type. Epitaxial wafers have been a prime method used in the semiconductor industry for the formation of lightly doped semiconductor layers on heavily doped semiconductor substrates or wafers. Epitaxial wafers also can have the advantage of providing a surface free of defects that can be grown into the substrate during the crystal formation process.

The epitaxial growth process for an ideal case is described below as depicted in FIG. 1. As mentioned above, epitaxy involves the deposition of a thin layer of semiconductor material, e.g., silicon, onto the surface of a single crystal semiconductor wafer while maintaining the same crystallographic orientation inherent in the wafer substrate. An epitaxial deposition process which is commonly used in the semiconductor industry is referred to as chemical vapor deposition (CVD), i.e., the growing of an epitaxial layer on a substrate from a gas.

Epitaxial deposition occurs in chamber 150 of an epitaxial reactor. This process is a high temperature process in which silicon source gases are reacted on the surface of a wafer to grow epitaxial silicon crystal. Wafer 100 rests on susceptor 160 during epitaxy. In a typical configuration, susceptor 160 may incorporate one or more wafer pockets 162 which are approximately as deep as half of the thickness of wafer 100 and is slightly larger in diameter than wafer 100. Wafer 100 and susceptor 160 is heated to temperatures ranging from 1000 deg. C. to 1200 deg. Celsius (° C.) for the process using infrared lamps or radio frequency power sources. During the CVD process silicon source gas molecules 120 can diffuse around the periphery of wafer 100 and between wafer 100 and susceptor 160. Typical silicon source gases are trichlorosilane and dichlorosilane (depicted in the figure as $SiH_2Cl_2$ 120). Hydrogen is the carrier gas ($H_2$ 122) used to transport the other chemical reactants to deposition chamber 150. The reaction in epitaxial chamber 150 is depicted below.

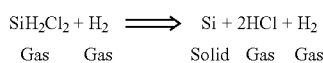

$$SiH_2Cl_2 + H_2 \Longrightarrow Si + 2HCl + H_2$$
$$\text{Gas} \quad \text{Gas} \quad\quad \text{Solid} \quad \text{Gas} \quad \text{Gas}$$

Silicon source gas 120 and dopant gas (not shown) may be also blended with hydrogen carrier gas 122 and injected into chamber 150. An exemplary P type dopant source gas is diborane and N type gas dopant sources are arsene or phosphene. Concentration of these dopants and layer thickness are controlled to produce very uniform electrical characteristics of epitaxial layer 110.

The CVD process described above has significant drawbacks when applied to epitaxy as will be explained below. A crystal substrate is manufactured by pulling crystal ingots from molten semiconductor material. The melt from which the ingot is pulled is doped with atoms in order to change the electrical characteristics of the material (e.g., the ingot may be doped with boron which acts as acceptors, or conversely the substrate may be doped with arsenic, phosphorus or antimony which acts as donors). The ingot is then divided into individual wafers by sawing, etching and polishing the semiconductor substrate into the desired shape and thickness. Silicon substrates used for epitaxial deposition often have a silicon oxide layer on the backside to prevent the dopant atoms in the substrate from out-gassing during the high temperature epitaxial process, as shown in FIG. 2A.

In the course of CVD, as the epitaxial growth process progresses, the wafer substrate and susceptor are heated at a high temperature in the hydrogen atmosphere of reactor chamber as discussed above. As the primary surface and periphery of the wafer is accepting the epitaxial layer, dopants in the wafer are often discharged into the high temperature vapor of the chamber from the underside or secondary surface of the wafer. The out-gassed dopants in the chamber are trapped within the vapor phase growing the epitaxial layer. These out-gassed dopants result in an "auto-doping" phenomenon and as a consequence, the concentration of dopants in the epitaxial layer becomes non-uniform. If uncontrolled, substrate out-gassing will produce poor resistivity uniformity in the epitaxial layer.

The prior art solution to the out-gassing problem is a layer of protection film applied to the secondary surface of a wafer prior to epitaxy as depicted in FIGS. 2A-2D. Protection layer film 220 is typically comprised of one of silicon dioxide and silicon nitride or the like. These protection layers are commonly deposited in a thermal furnace or deposition reactor, however, those of ordinary skill in the art will recognized other formation means including growing an oxide protection layer by thermal oxidation. Protection layer 220 is typically between 3000 to 10,000 angstroms (Å) in thickness.

Protection layer 220 performs two primary functions: the protection film on the secondary surface of wafer 100 prevents dopant atoms in substrate 100 from out-gassing during the high temperature epitaxy process; and also the protection layer protects substrate 100 from being etched by the high temperature gasses in chamber 150. Without the protection layer on the secondary surface of the wafer, the gaseous hydrogen and deposition byproducts (HCl, Cl2) in the chamber will etch away the substrate adjacent to susceptor 160, thereby releasing even more dopant into chamber 150. Optionally, protection layer 220 can be extended to cover the periphery of wafer 100 in order to seal more surface area of the substrate.

Sealing the wafer dopant atoms in the wafer is necessary to prevent the out-gassing dopant atoms from being incorporated into the growing epitaxial layer. If uncontrolled, the substrate dopants released into the chamber from out-gassing will auto-dope the epitaxial layer and generally result in poor resistivity uniformity in the epitaxial layer.

However, when forming epitaxial layer 110 on substrate 100, the silicon source gas molecules present in the CVD epitaxy process preferentially deposit on silicon surfaces over silicon oxide or nitride surfaces of protection layer 220.

This preferential deposition is due to a reluctance of the silicon source gas molecules to seed on the silicon oxide or nitride surfaces. No initial seed deposition will take place on the silicon oxide or nitride until sufficient gas density is present and sufficient nucleation time has passed. This preferential deposition 220 will cause nodules to form 232 due to pin holes or porosity in protection layer 220 which expose the underlying silicon of substrate 100 and which then acts as a seed site for nodule growth. These needle-like silicon projects, shown in spur projection 222 in FIG. 2C, occur when the source gas enters a pore or pinhole in protection layer 220, causing the silicon to grow abnormally into a needle shaped projection through the protection layer and onto susceptor 160. Another, more common result is the formation of nodules 232 that are attracted by islands of silicon deposition that seed on protection layer 220. These islands of silicon then attract more silicon deposition resulting in nodule formation. Similarly, the formation of spur projection 222 also attract or seed nodule growth. The fugitive gases which lead to the formation of the nodules and spur projections come from the source gases that are injected into the epitaxial reactor for the deposition of the epitaxial layer. A second source for the fugitive gases is the etching of silicon that has deposited on the susceptor prior to or during the epitaxy process. Silicon that has deposited on the susceptor is etched away into the vapor phase by deposition gases and byproducts (Hydrogen, HCl, Cl2). These gaseous silicon molecules then act as a source gas for the formation of nodules on the protection layer.

The formation of silicon nodules 232 result in a non-uniform secondary surface that cause particulate problems, abrasion of wafer carriers, poor focus in photolithography processes and the inability to obtain good vacuum on a wafer vacuum-chuck. Spur projections 222 and silicon nodules 232 are prone to separate from the substrate during transfer and handling of the wafer, thereby contribute to generation of unwanted particulate matter. Additionally, during epitaxy the preferential deposition of the source gas on the substrate material over the protection layer material can increase the occurrence epitaxial crowns 234, which are extraordinary growths of epitaxial silicon at the junction of epitaxial layer 110 and protection layer 220.

The occurrence of nodules require an extra polishing step, if permissible, subsequent to the epitaxial deposition. Prior art methods for controlling nodule formation during epitaxy required a tradeoff in the severity of the nodules and the effectiveness of the dopant protection layer. One approach is to remove the protection layer near the edge of the wafer to expose the wafer. This portion of the exposed wafer then acts as a seed layer for silicon to deposit on, but as a smooth film layer rather than uneven nodules. This approach has the disadvantage of exposing the wafer (i.e., the seed layer) to the epitaxial chamber which out-gasses dopant during the high temperature epitaxy process and auto-doping the epitaxial layer, thereby impairing epitaxial resistivity uniformity.

Another approach is to modify the design of the susceptor pocket 162 with the goal of reducing the amount of fugitive gases that diffuse to the secondary surface of the wafer. In addition the pocket can be modified to reduce the amount of contact between the susceptor and wafer and/or increase the distance between portions of the wafer and the susceptor. Pocket designs that are used to accomplish these goals include providing a step near the pocket edge or forming the pocket with a dish or conical shape. These pocket modifications have the disadvantage of decreasing the thermal coupling of the wafer to the susceptor which can create non-uniform temperature profiles across the wafer which adversely affect the epitaxy process

SUMMARY OF THE INVENTION

This invention is a novel method that eliminates the formation of backside or edge nodules on the protection layer (dopant seal layers) during epitaxial deposition by providing a favorable seed layer over the protection layer. Additionally, the present invention does not result in a reduction of dopant uniformity in the epitaxial because the dopant seal layers are not compromised in reducing the formation occurrence of nodules.

In accordance with one exemplary embodiment of the present invention, a wafer for epitaxial deposition is backside sealed with a dopant seal layer. Then, a layer of polysilicon is formed coextensively over the dopant seal layer. This polysilicon film can be deposited using common techniques used in silicon wafer manufacturing or semiconductor manufacturing. Typically the seed layer could be 1000 Å to 10,000 Å thick, but as a practical matter need only have a thickness sufficient for attaching fugitive gasses on the backside of the wafer during subsequent processing stages. The polysilicon layer acts as a seed layer for potentially nodule forming source gasses that diffuse to the substrate periphery and backside during epitaxial deposition. During CVD epitaxy, the epitaxial layer is deposited on the primary surface with optimal resistivity uniformity. The fugitive gasses which diffuse to the wafer backside and edge will now deposit on the seed layer as a film instead of in forming as unwanted nodules. The polysilicon layer acts as a continuous seed layer which eliminates the preferential deposition at seal layer pinholes or island seed sites.

The resulting structure of silicon substrate, dopant seal layer, polysilicon seed layer provides for nodule-free epitaxial deposition without increasing auto-doping or reducing the epitaxial resistivity uniformities.

In accordance with another exemplary embodiment of the present invention, a wafer for epitaxial deposition is sealed on the backside and peripheral edges with a dopant seal layer. Then, a layer of polysilicon is formed over the entire extent of the dopant seal layer. Here, the amount of out-gassing is still further reduced because the peripheral edges of the wafer are covered with the dopant seal layer and since that layer is not exposed to the reaction gases, silicon spur and nodule formation is thwarted. Moreover, because the amount of out-gassing is even further reduced, auto-doping to the epitaxial layer is correspondingly lessened, as are epitaxial resistivity non-uniformities.

BRIEF DESCRIPTION OF THE DRAWINGS

The novel features believed characteristic of the present invention are set forth in the appended claims. The invention itself, however, as well as a preferred mode of use, further objectives and advantages thereof, will be best understood by reference to the following detailed description of an illustrative embodiment when read in conjunction with the accompanying drawings wherein:

FIGS. 2A-2D are cross-sectional diagrams of a wafer undergoing epitaxial layer formation in which a layer of protection film is applied to the secondary surface of a wafer prior to epitaxy as the prior art solution for out-gassing problem;

FIG. 5 is a flowchart representing the steps for epitaxial layer formation with low occurrence of silicon nodule formation, while simultaneously substantially reducing auto-doping, resulting in a wafer with epitaxial resistivity uniformity and a smooth backside in accordance with exemplary embodiments of the present invention.

Figure 1:
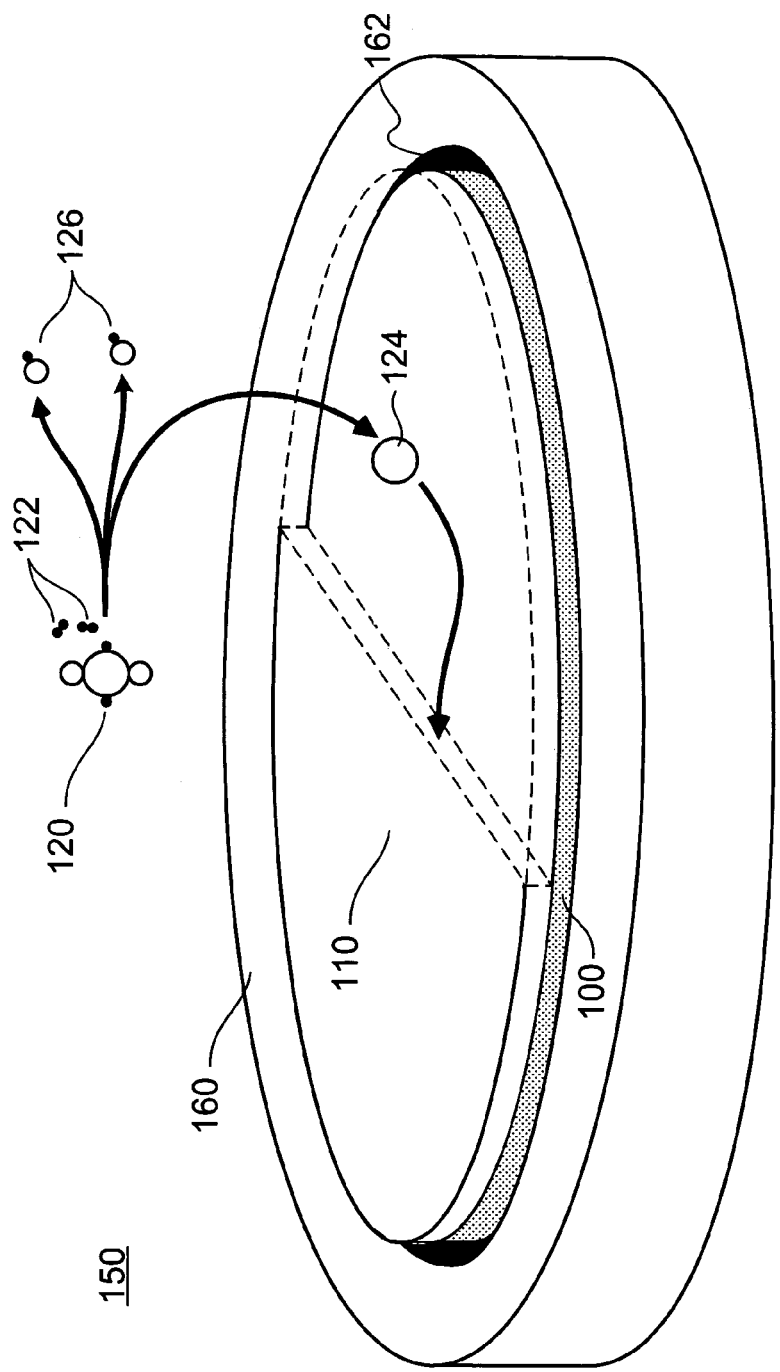
FIG. 1 is a graphical depiction of the CVD epitaxial growth process for an ideal case as understood in the prior art.

Other features of the present invention will be apparent from the accompanying drawings and from the following detailed description.

EXPLANATION OF ITEMS 100 wafer (substrate) epitaxial layer
110 epitaxial layer
120 silicon source gas molecule
122 hydrogen carrier gas
124 silicon molecule surface
126 hydrogen chloride
150 reactor chamber
160 susceptor
162 susceptor wafer pocket
220 protective layer on wafer's secondary surface
222 silicon spur projection
spur projection as a seed site for nodule growth
232 silicon nodules epitaxial layer from nodules
240 nodule growth on seed site island of silicon, precipitating further nodule growth
410 epitaxial layer
412 film deposition on seed layer from fugitive gasses on wafer's secondary surface
430 seed layer on wafer's secondary surface
610 epitaxial layer
612 film deposition on seed layer from fugitive gasses on wafer's secondary surface
614 film deposition on seed layer from fugitive gasses on wafer's peripheral edges
620 protective layer on wafer's secondary surface
622 protective layer on wafer's peripheral edges
630 seed layer on wafer's secondary surface
seed layer on wafer's peripheral edges

DETAILED DESCRIPTION OF THE INVENTION

Figure 3:
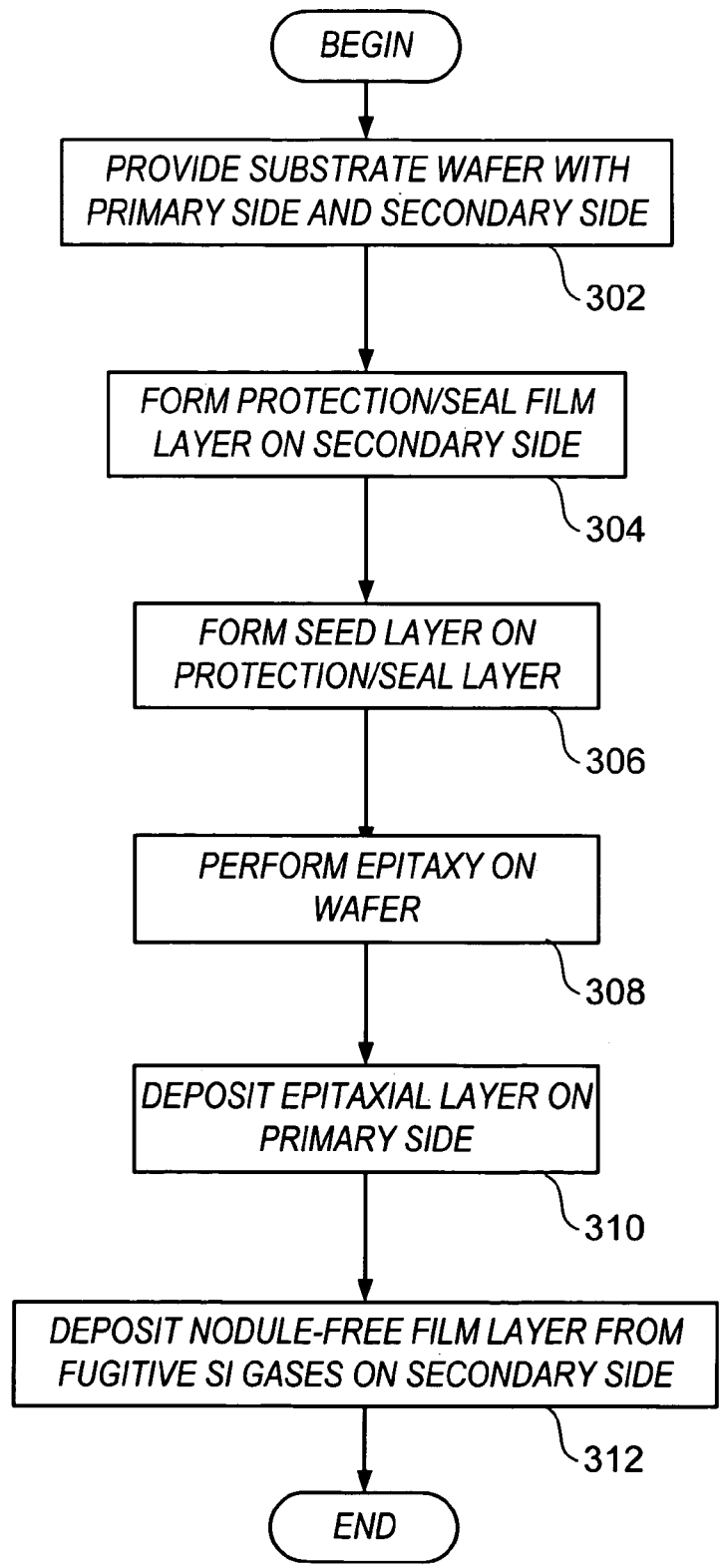
FIG. 3 is a flowchart representing the steps for epitaxial layer formation with low occurrence of silicon nodule formation, while simultaneously reducing auto-doping, resulting in a wafer with epitaxial resistivity uniformity and a smooth backside in accordance with exemplary embodiments of the present invention.
Figure 4A:
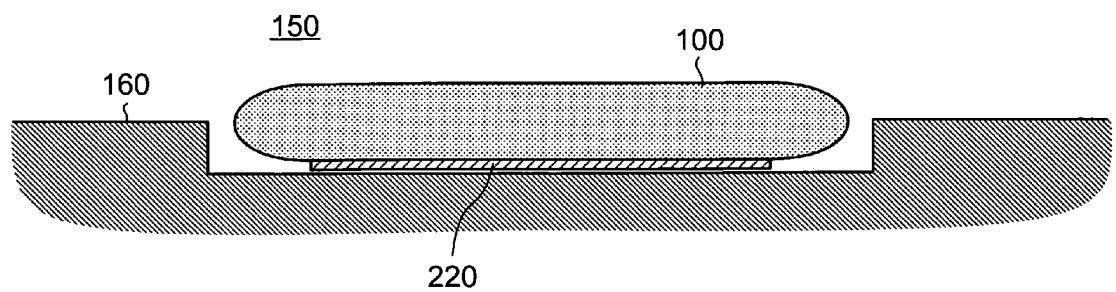
FIGS. 4A-4C depict cross-sectional diagrams of process stages wafer 100 at various stages of the present epitaxy method of FIG. 3 and in accordance with exemplary embodiments of the present invention.
Figure 4B:
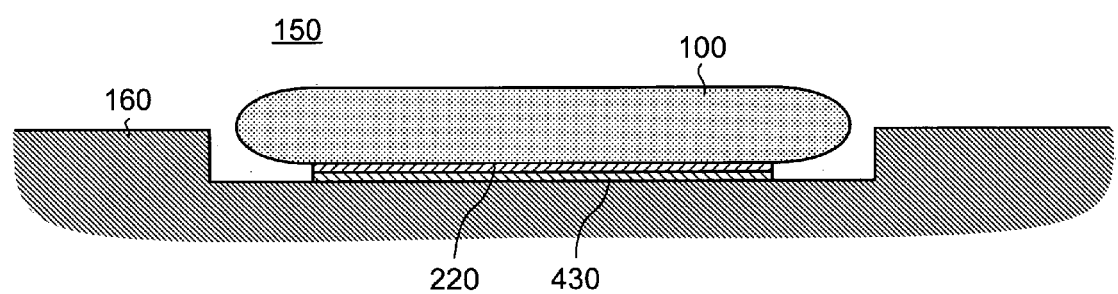
Figure 4C:
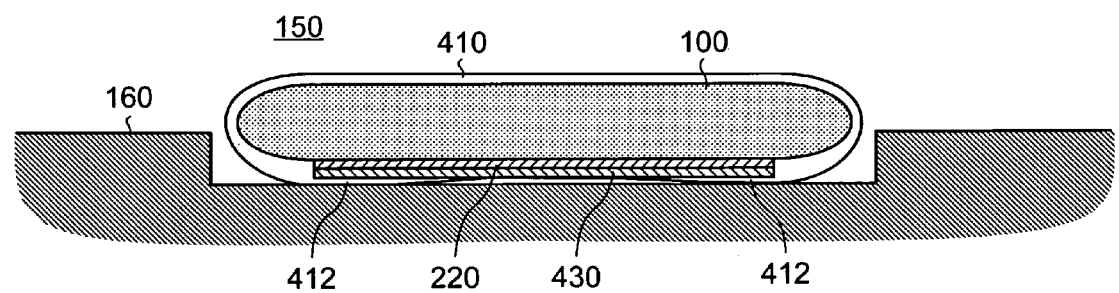

FIG. 3 is a flowchart representing the steps for epitaxial layer formation with low occurrence of silicon nodule formation, while simultaneously reducing auto-doping, resulting in a wafer with exceptional epitaxial resistivity uniformity and a smooth backside in accordance with exemplary embodiments of the present invention. It should be understood that the present exemplary embodiments are described with reference to the formation of a single crystal epitaxial layer on the primary surface of the wafer, however it should be understood that this is merely an exemplary embodiment which was selected for accurately describing the presently present invention. The present invention is equally applicable to the formation of other types of surfaces which, during their formation, produce fugitive gasses which disperse as fugitive gasses to the secondary surfaces and form nodules, these surface layers include, for example, poly silicon. FIGS. 4A-4C depict cross-sectional diagrams of process stages wafer 100 at various stages of the present epitaxy method of FIG. 3 and in accordance with exemplary embodiments of the present invention.

FIG. 4A schematically depicts susceptor 160 for supporting wafer 100 in reaction chamber 150 of a conventional epitaxial reactor. The process begins by providing a substrate wafer for epitaxy with a primary, designed as such for device fabrication, and a secondary surface (or wafer backside) (step 302). Next, dopant seal layer 220 is formed on the secondary surface of wafer 100(step 304). Protection/seal film layer 220 is typically comprised of one of silicon oxide, silicon dioxide and silicon nitride, or the like. Typically the protection layer is silicon oxide. In the industry, these steps are commonly performed by the wafer's manufacturer. These protection layers are commonly deposited in a thermal furnace or deposition reactor, however, those of ordinary skill in the art will recognized other formation means including growing an oxide protection layer by thermal oxidation. Optimally, secondary surface protection/seal film layer 220 is formed over the entire backside surface of the wafer 100 in order to minimize out-gassing from the wafer. In general, and as known in the art, in order to obtain the secondary surface protective film, a protective layer of an oxide or a nitride is formed on the primary and secondary surfaces of wafer 100 and along its peripheral edges in a diffusion furnace, etc. Unwanted protective film on the primary surface and peripheral edges is then polished or chemically etched off. Furthermore, however, assuming the layer's thickness is within tolerance, polishing may be deferred until the application of the seed layer, in accordance with the present invention. Alternatively, the protection layer 220 can be formed only on the secondary and peripheral surfaces eliminating the need for removal on the primary. The thickness of protection layer 220 on the secondary surface is typically between 3000 Å and 10,000 Å, but the precise thickness is determined by a variety of factors such as the type of dopant used and its concentration and the temperature and duration of subsequent processing steps. With the application of layer 220, impurity dopants contained in the wafer are prevented from out-gassing into reaction chamber 150 through the back surface of wafer 100 during epitaxy.

Next, seed layer 430 of polysilicon is formed on protection layer 220 as depicted in FIG. 4B (step 306). For maximum effectiveness, seed layer 430 should be coextensive with protection layer 220. The polysilicon layer is commonly deposited in a thermal furnace or deposition reactor as is well known in the relevant art. For instance it is well known in the relevant art to form a polysilicon layer by the thermal decomposition of Silane ($SiH_4$) or deposition of polysilicon from dichlorosilane or trichlorosilane. At this point, the wafer is polished to remove the unnecessary amounts of protection layer 220 and seed layer430, if present, on the primary surface and peripheral edges of wafer 100. Alternatively, seed layer 430 may be formed only on protection layer 220 on the secondary surface after unwanted amounts of protection layer 220 on wafer 100 have been polished or etched away. Here, seed layer 430 is described as being comprised of polysilicon layer, but this is merely an exemplary embodiment chosen for accurately describing the presently present invention. Alternative seed layer 430 may be comprised of any material such as semiconductor material which acts as a continuous seed layer and thereby eliminates the preferential deposition of fugitive gasses at seal layer pinholes or island seed sites as nodules. Seed layer 430 may also be comprised of other combinations of silicon, germanium and/or carbon, for example SiGe alloy, pure Ge, SiGeC alloy, or the like. Additionally, the type of material chosen for seed layer 430 may also be dependent on the type of gasses diffusing around the periphery of wafer 100 and between wafer 100 and susceptor 160, i.e., the type of material using in seed layer 430 is depending on the type of fugitives gasses which are diffusing to the backside of the wafer and forming nodules.

Wafer 100 is now ready for epitaxy (step 308). One advantage of the present invention is that the epitaxial growth process is performed in the conventional manner practiced in the prior art without any modifications to the reaction chamber, such as reshaping susceptor 160 for minimizing contact with wafer 100.

As is well understood in the art, epitaxial layer 410 is formed on the primary surface of wafer 100 as depicted in FIG. 4C(step 310). However, fugitive gasses which diffuse to the secondary surface of the wafer, between seed layer 430 and susceptor 160, are now deposited on seed layer 430 as film 412 rather than as silicon nodules (step 312). Likewise, the formation of silicon spurs is also avoided because pore spaces and pinholes in protection layer 220 are further sealed by the polysilicon seed layer 430. The extent of film 412 is determined by the volume of fugitive gases which are present for deposition. Typically, because these fugitive gases are immediately attracted to seed layer 430, the formation of film 412 is constrained to only the outer peripheral extent of seed layer 430, perhaps only 10 mm to 12 mm from the edge of wafer 100. Furthermore, because these results are achieved without decreasing the surface area of protection layer 220 (i.e., for exposing substrate 100 for a seed region), out-gassing is also reduced. A corresponding increase in resistivity uniformity of epitaxial layer 410 is realized. Still further, because the silicon nodules cannot form in regions of protection layer 220 proximate to epitaxial layer 410, the likelihood and severity of epitaxial crown formation on the peripheral edges of epitaxial layer 410 are also decreased.

In accordance with another exemplary embodiment of the present invention, the protection layer is expanded to cover the peripheral edges of the wafer. The surface area of the seed layer is correspondingly increased, coextensive with the protection layer. This embodiment has several advantages over the previously disclosed embodiment, including potentially fewer process steps (i.e., lessening the process complexity), and increased protection to, and sealing of, the substrate wafer (resulting in lower out-gassing amounts and less severe hydrogen etching of the wafer due to the decreased surface area of the wafer exposed to the chamber).

Figure 6A:
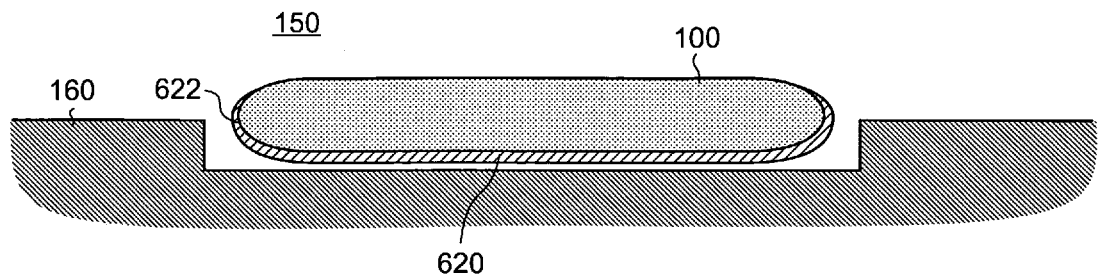
FIGS. 6A-6C depict a cross-sectional diagrams of wafer 100 during process stages the present epitaxy method of FIG. 5 and in accordance with exemplary embodiments of the present invention.
Figure 6B:
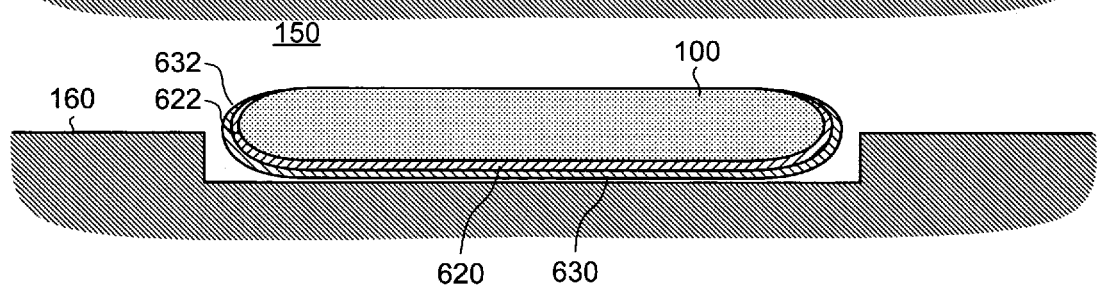
Figure 6C:
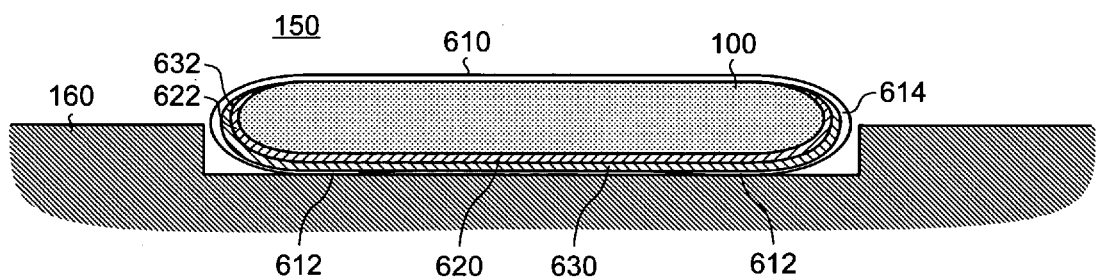

FIG. 5 is a flowchart representing the steps for epitaxial layer formation with low occurrence of silicon nodule formation, while simultaneously substantially reducing auto-doping, resulting in a wafer with epitaxial resistivity uniformity and a smooth backside in accordance with exemplary embodiments of the present invention. FIGS. 6A-6C depict cross-sectional diagrams of process stages for wafer 100 during the present epitaxy method of FIG. 5 and in accordance with exemplary embodiments of the present invention.

The structure of the components in FIGS. 6A-6C correspond to those shown in FIGS. 4A-4D and corresponding figure elements are labeled identically. In accordance with this embodiment, the process begins by providing a substrate wafer for epitaxy as described above (step 502). Next, protection layer 620 (a dopant seal layer) is formed not only on the secondary surface of wafer 100 (step 504), but also as peripheral edge protection layer 622 on the edges of the wafer(step 506). Again, this layer is typically comprised of one a silicon oxide, silicon dioxide or silicon nitride or the like, conventionally silicon oxide. In contrast with the previous embodiment, after the protection layers are deposited on the primary and secondary wafer sides and along its peripheral edges of wafer 100, only the protection layer on the primary surface need be polished off. Peripheral edge protection layer 622 remains. Alternatively, the protection layer is only formed on the secondary and peripheral surfaces eliminating the need to remove the protection layer from the primary surface. Because wafer manufacturers typically coat the entire wafer with silicon oxide and then polish or chemically etch off unwanted areas of oxide, polishing or etching need only be performed on the primary surface, in accordance with this exemplary embodiment.

Seed layer 630 is then formed on protection layer 620 and peripheral edge seed layer 632 is formed on peripheral edge protection layer 622 as depicted in FIG. 6B (step 508). Here again, the intent is to completely cover the protection layer with the seed layer for achieving optimal results. Any portions of protection layer 620 or peripheral edge protection layer 622 left open to the chamber will increase the occurrences of nodule formation and result in abrasion of wafer carriers, poor focus in photolithography processes, inability to obtain good vacuum on a wafer vacuum-chuck and increased particulate matter in the vapor phase epitaxial growth and subsequent process stages. The polysilicon layer is typically formed by the thermal decomposition of Silane ($SiH_4$) or deposition of polysilicon from dichlorosilane or trichlorosilane. Wafer 100 is then polished to remove the unnecessary amounts of protection layer and seed layer, if any, on the primary surface of wafer 100.

Epitaxial layer 610 can now be grown on wafer 100 is now ready for epitaxy (step 510), on the primary surface of wafer 100 as depicted in FIG. 6C, while fugitive gasses are now deposited on seed layer 630 as film 612 (step 512)and on peripheral edge seed layer 632 as peripheral edge film 614 rather than as silicon nodules (step 514). A superior quality epitaxial layer is thereby achieved without nodule formation and without decreasing the surface area of protection layer 620 for exposing substrate 100 for a seed region. Thus, out-gassing is not increased because the surface area of protection layer 620 is not compromised as a trade-off for reducing nodule formation, as is the practiced in the prior art. A corresponding increase in resistivity uniformity of epitaxial layer 610 is realized.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention including using wafer substrates other than silicon. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method for forming semiconductor wafer which resists the formation of backside or edge nodules comprising:
    forming a wafer, said wafer having a primary surface and a secondary surface opposite the primary surface;
    forming a protection layer on the secondary surface of the wafer;
    forming a seed layer of semiconductor material on said protection layer and over the secondary surface of the wafer, and
    simultaneously growing an epitaxial layer over said primary surface of said wafer and forming a film layer on at least a portion of the seed layer of the secondary surface.

2. The method recited in claim 1, wherein forming a seed layer over said protection layer further comprises:
    limiting a surface area of said seed layer to substantially coextend with a surface area of said protection layer.

3. The method recited in claim 1, wherein forming a wafer further comprises:
    doping a substrate material with an impurity.

4. The method recited in claim 1, wherein the protection layer is comprised of one of silicon oxide, silicon dioxide and silicon nitrate.

5. The method recited in claim 1, wherein the seed layer is comprised of a polysilicon.

6. The method recited in claim 1 further comprises:
    forming said protection layer over a peripheral edge of said wafer; and
    forming said seed layer over said peripheral edge of said wafer.

7. The method recited in claim 6, wherein simultaneously growing an epitaxial layer over said primary surface of said wafer and forming a film layer on at least a portion of the seed layer of the secondary surface further comprises:
    forming the film layer on at least a portion said peripheral edge of said wafer.

8. The method recited in claim 7, wherein forming a wafer further comprises:
    doping a substrate material with an impurity.

9. The method recited in claim 7, wherein the protection layer is comprised of one of silicon oxide, silicon dioxide and silicon nitrate.

10. The method recited in claim 7, wherein the seed layer is comprised of a polysilicon.

11. The method recited in claim 1, wherein the seed layer is comprised of at least two of silicon, germanium and carbon.

12. The method recited in claim 7, wherein the seed layer is comprised of at least two of silicon, germanium and carbon.

13. A method for forming semiconductor wafer which resists the formation of backside or edge nodules comprising:
    forming a wafer, said wafer having a primary surface and a secondary surface opposite the primary surface;
    forming a protection layer on the secondary surface of the wafer;
    forming a seed layer of semiconductor material on said protection layer and over the secondary surface of the wafer, and
    simultaneously forming a polysilicon layer over said primary surface of said wafer and forming a film layer on at least a portion of the seed layer of the secondary surface.

14. The method recited in claim 13, wherein simultaneously forming a polysilicon layer over said primary surface of said wafer and forming a film layer on at least a portion of the seed layer of the secondary surface further comprises:
    forming the film layer on at least a portion said peripheral edge of said wafer.

15. The method recited in claim 13, wherein the seed layer is comprised of at least two of silicon, germanium and carbon.

16. The method recited in claim 14, wherein the seed layer is comprised of at least two of silicon, germanium and carbon.

17. The method recited in claim 13, wherein forming a seed layer over said protection layer further comprises:
    limiting a surface area of said seed layer to substantially coextend with a surface area of said protection layer.

18. The method recited in claim 13, wherein forming a wafer further comprises:
    doping a substrate material with an impurity.

19. The method recited in claim 13, wherein the protection layer is comprised of one of silicon oxide, silicon dioxide and silicon nitrate.

20. The method recited in claim 13, wherein the seed layer is comprised of a polysilicon.

21. The method recited in claim 13 further comprises:
    forming said protection layer over a peripheral edge of said wafer; and
    forming said seed layer over said peripheral edge of said wafer.

22. The method recited in claim 21, wherein simultaneously forming a polysilicon layer over said primary surface of said wafer and forming a film layer on at least a portion of the seed layer of the secondary surface further comprises:
    forming the film layer on at least a portion said peripheral edge of said wafer.

23. The method recited in claim 22, wherein forming a wafer further comprises:
    doping a substrate material with an impurity.

24. The method recited in claim 22, wherein the protection layer is comprised of one of silicon oxide, silicon dioxide and silicon nitrate.

25. The method recited in claim 22, wherein the seed layer is comprised of a polysilicon.

26. The method recited in claim 22, wherein the seed layer is comprised of at least two of silicon, germanium and carbon.

* * * * *